(12) United States Patent
Ishitobi et al.

(10) Patent No.: US 12,272,990 B2
(45) Date of Patent: Apr. 8, 2025

(54) UNINTERRUPTIBLE POWER SUPPLY DEVICE

(71) Applicant: TMEIC Corporation, Chuo-ku (JP)

(72) Inventors: Hidetaka Ishitobi, Chuo-ku (JP); Tsubasa Sasaki, Chuo-ku (JP)

(73) Assignee: TMEIC Corporation, Chuo-ku (JP)

( * ) Notice: Subject to any disclaimer, the term of this patent is extended or adjusted under 35 U.S.C. 154(b) by 0 days.

(21) Appl. No.: 18/546,539

(22) PCT Filed: Dec. 6, 2021

(86) PCT No.: PCT/JP2021/044731
§ 371 (c)(1),
(2) Date: Aug. 15, 2023

(87) PCT Pub. No.: WO2023/105576
PCT Pub. Date: Jun. 15, 2023

(65) Prior Publication Data
US 2024/0305130 A1    Sep. 12, 2024

(51) Int. Cl.
*H02J 9/06*    (2006.01)
*H05K 7/20*    (2006.01)
(Continued)

(52) U.S. Cl.
CPC .............. *H02J 9/062* (2013.01); *G01F 1/30* (2013.01); *H02B 1/00* (2013.01); *H02J 9/06* (2013.01);
(Continued)

(58) Field of Classification Search
CPC .... G01F 1/30; H02J 9/06; H02J 9/062; H05K 7/14325; H05K 7/20172; H05K 7/20
(Continued)

(56) References Cited

U.S. PATENT DOCUMENTS 10,164,464 B1 * 12/2018 Ross .................... G06F 1/263
2003/0221817 A1    12/2003 Smith et al.
(Continued)

FOREIGN PATENT DOCUMENTS

JP            8-126329 A      5/1996
JP         2006-512627 A      4/2006
(Continued)

OTHER PUBLICATIONS

Written Opinion of the International Searching Authority issued on Jan. 25, 2022 in PCT/JP2021/044731 (with English translation), 11 pages.
(Continued)

*Primary Examiner* — Rexford N Barnie
*Assistant Examiner* — Xuan Ly
(74) *Attorney, Agent, or Firm* — Oblon, McClelland, Maier & Neustadt, L.L.P.

(57) ABSTRACT

An uninterruptible power supply device that includes a housing having a rectangular parallelepiped shape, a plurality of power conversion units, and a bus unit for connecting the plurality of power conversion units in parallel to each other. The plurality of power conversion units are stacked in a vertical direction and housed in the housing. The bus unit is arranged in the housing to face a rear surface of the housing. The bus unit includes a plurality of buses extending in the vertical direction, at least one support member that supports the plurality of buses such that the plurality of buses are spaced apart from each other in a horizontal direction, and at least one fixing member that removably fixes each support member to the housing.

11 Claims, 7 Drawing Sheets

(51) Int. Cl.
     *G01F 1/30*        (2006.01)
     *H02B 1/00*        (2006.01)
     *H05K 7/14*        (2006.01)

(52) U.S. Cl.
     CPC ..... *H05K 7/14325* (2022.08); *H05K 7/20172* (2013.01)

(58) Field of Classification Search
     USPC .......................................... 307/64; 361/600
     See application file for complete search history.

(56) References Cited

U.S. PATENT DOCUMENTS

| | | |
|---|---|---|
| 2010/0138586 A1 | 6/2010 | Wassermann et al. |
| 2013/0043729 A1 | 2/2013 | Yoshida et al. |

FOREIGN PATENT DOCUMENTS

| | | |
|---|---|---|
| JP | 2013-106473 A | 5/2013 |
| WO | WO 2011/135712 A1 | 11/2011 |

OTHER PUBLICATIONS

International Search Report issued Jan. 25, 2022 in PCT/JP2021/044731, filed on Dec. 6, 2021, 3 pages.

\* cited by examiner

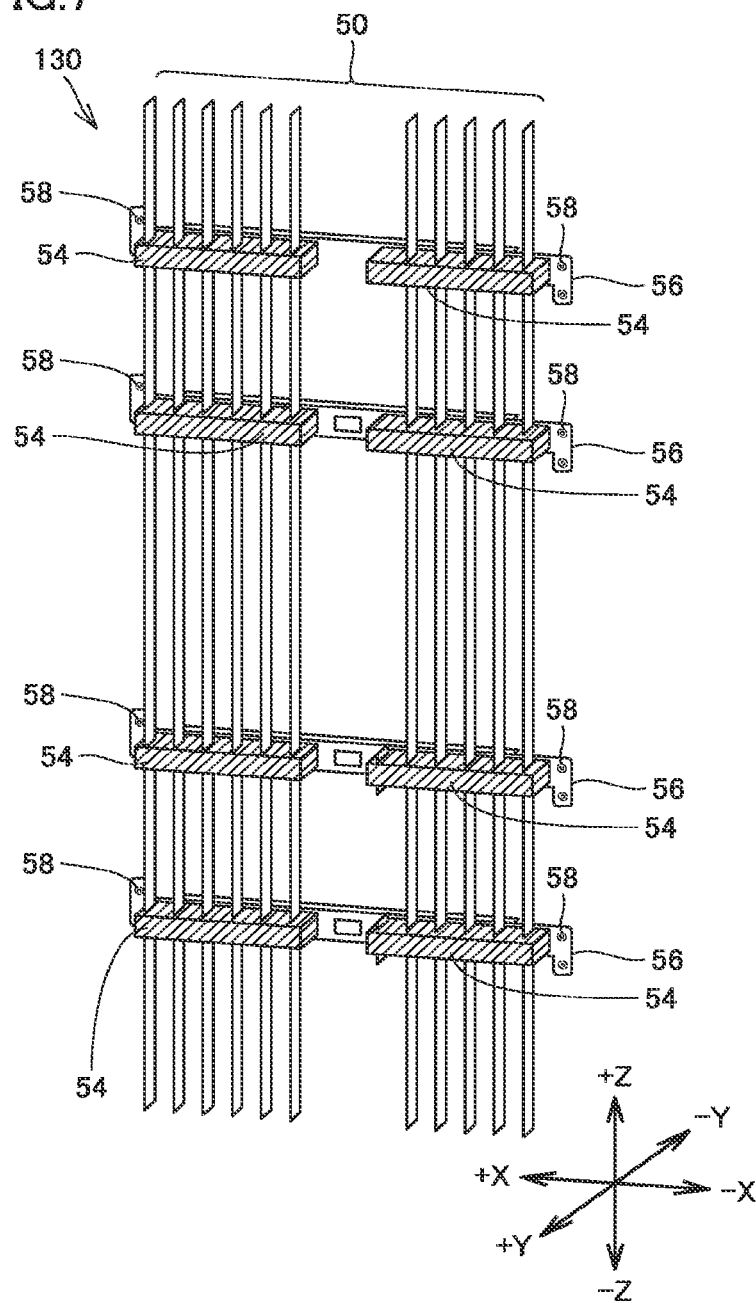

UNINTERRUPTIBLE POWER SUPPLY DEVICE

TECHNICAL FIELD

The present disclosure relates to an uninterruptible power supply device.

BACKGROUND ART

Japanese Patent Laying-Open No. 8-126329 (PTL 1) discloses an uninterruptible power supply device including a plurality of multifunctional units connected in parallel to a load. Each of the multifunctional units includes a conversion unit including a converter, an inverter and a DC capacitor, the conversion unit being provided as a component having a capacity that is one n-th (n is plural) of a device capacity. The plurality of multifunctional units are stacked in a vertical direction and housed in a housing.

CITATION LIST

Patent Literature

PTL 1: Japanese Patent Laying-Open No. 8-126329

SUMMARY OF INVENTION

Technical Problem

In the uninterruptible power supply device described in PTL 1, when a capacity of the load increases, a multifunctional unit can be added to cope with the increase in capacity of the load. However, the increase in capacity of the load causes an increase in current flowing through a bus that electrically connects the plurality of multifunctional units in parallel, which requires an increase in size of the bus, such as an increase in cross-sectional area of the bus. As a result, the work for replacing a plurality of buses housed in the housing requires much labor.

The present disclosure has been made to solve the above-described problem, and an object thereof is to provide an uninterruptible power supply device that can simply and easily achieve a change in capacity of the uninterruptible power supply device.

Solution to Problem

An uninterruptible power supply device according to an aspect of the present disclosure includes: a housing having a rectangular parallelepiped shape; a plurality of power conversion units; and a bus unit. The plurality of power conversion units are stacked in a vertical direction and housed in the housing. The bus unit connects the plurality of power conversion units in parallel to each other. The bus unit is arranged in the housing to face a rear surface of the housing. The bus unit includes: a plurality of buses extending in the vertical direction; at least one support member that supports the plurality of buses such that the plurality of buses are spaced apart from each other in a horizontal direction; and at least one fixing member that removably fixes each support member to the housing.

Advantageous Effects of Invention

According to the present disclosure, there can be provided an uninterruptible power supply device that can simply and easily achieve a change in capacity of the uninterruptible power supply device.

BRIEF DESCRIPTION OF DRAWINGS

FIG. 7 is an external view schematically showing a configuration example of a bus unit.

DESCRIPTION OF EMBODIMENTS

Figure 1:
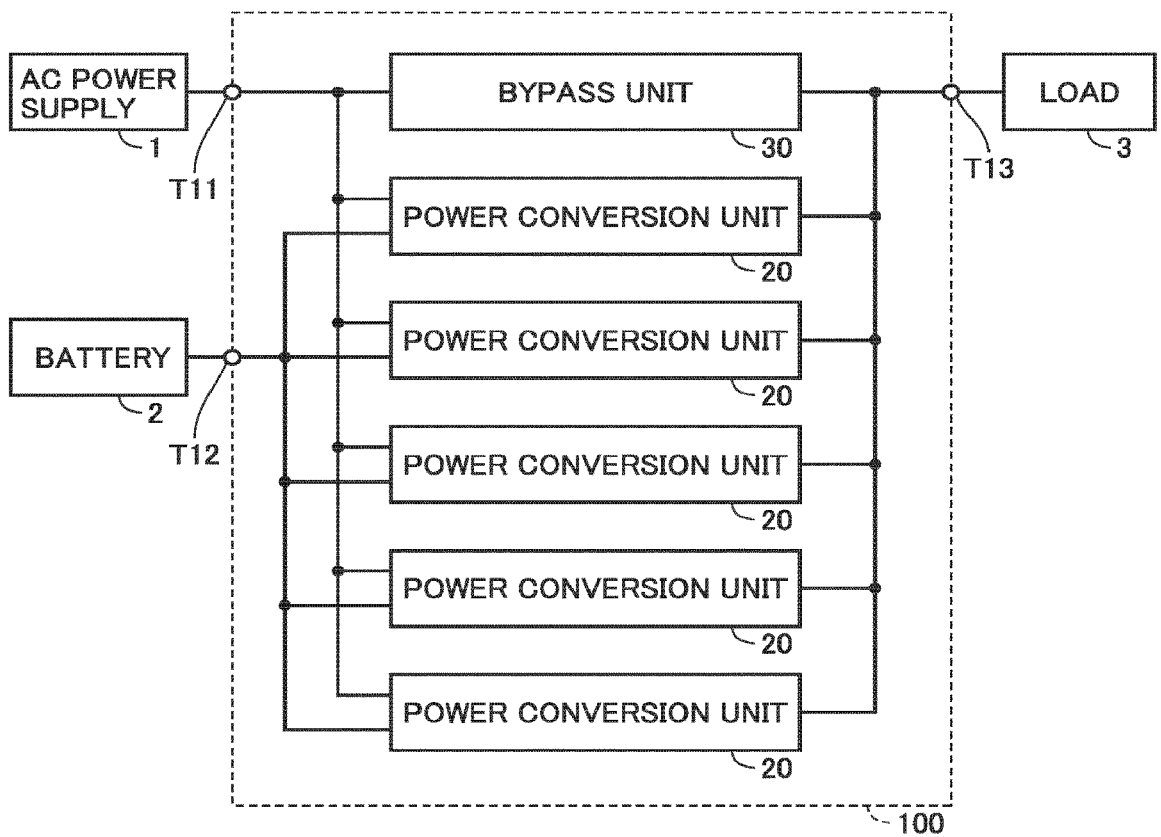
FIG. 1 is a circuit block diagram showing a configuration example of an uninterruptible power supply device according to an embodiment.

An embodiment of the present disclosure will be described in detail hereinafter with reference to the drawings, in which the same or corresponding portions are denoted by the same reference characters and description thereof will not be repeated.

FIG. 1 is a circuit block diagram showing a configuration example of an uninterruptible power supply device according to an embodiment. In a normal state, an uninterruptible power supply device 100 according to the present embodiment supplies electric power to a load 3, using AC power supplied from an AC power supply 1 such as a commercial AC power supply. When a power failure of AC power supply 1 occurs, uninterruptible power supply device 100 according to the present embodiment supplies electric power to load 3, using DC power supplied from a battery 2.

Referring to FIG. 1, uninterruptible power supply device 100 includes an input terminal T11, a battery terminal T12, an output terminal T13, a plurality of power conversion units 20, and a bypass unit 30.

Input terminal T11 is connected to AC power supply 1 and receives AC power of a commercial AC frequency. Output terminal T13 is connected to load 3. Battery terminal T12 is connected to battery 2. Battery 2 stores DC power. Battery 2 corresponds to an example of "power storage device". Instead of battery 2, a capacitor may be connected.

The plurality of power conversion units 20 and bypass unit 30 are connected in parallel to each other between input terminal T11 and output terminal T13. Input terminal T11, output terminal T13 and battery terminal T12 are housed in a not-shown terminal unit.

Figure 2:
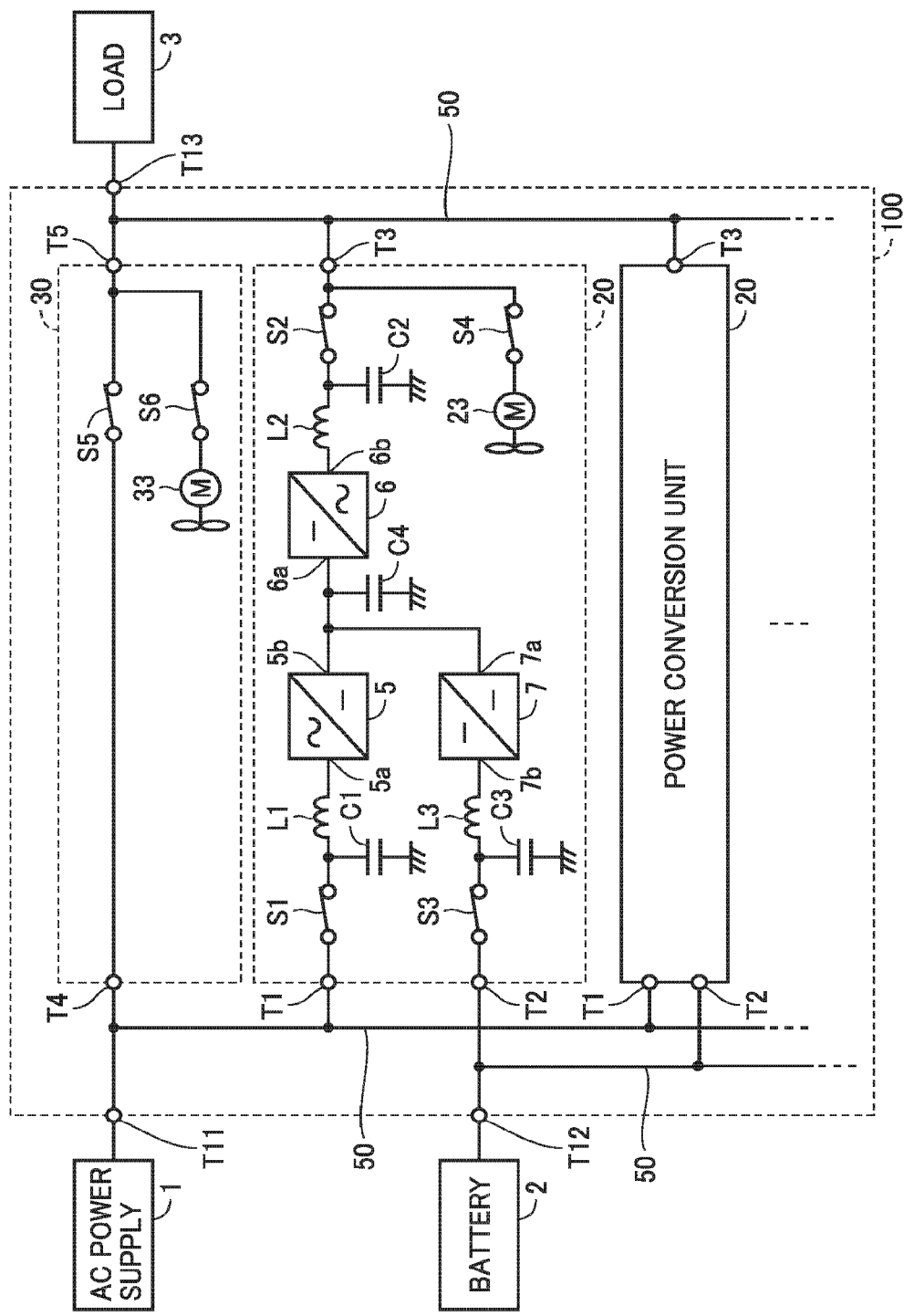
FIG. 2 is a circuit block diagram showing configuration examples of power conversion units and a bypass unit.

FIG. 2 is a circuit block diagram showing configuration examples of power conversion units 20 and bypass unit 30.

Referring to FIG. 2, each power conversion unit 20 includes an input terminal T1, an output terminal T3, a battery terminal T2, switches S1 to S4, capacitors C1 to C4, reactors L1 to L3, a converter 5, an inverter 6, a bidirectional chopper 7, and a fan 23.

Terminals T1, T2 and T3 are electrically connected to terminals T11, T12 and T13 by a bus 50, respectively.

Switch S1 and reactor L1 are connected in series between input terminal T1 and an input node 5a of converter 5. Capacitor C1 is connected between a node between switch S1 and reactor L1 and a reference voltage line. Switch S1 is turned on in a normal state in which AC power is supplied from AC power supply 1, and is turned off, for example, at the time of maintenance of power conversion units 20. Capacitor C1 and reactor L1 constitute an AC input filter (low-pass filter) that passes AC power from AC power supply 1 to converter 5 and suppresses leakage of a signal of a carrier frequency generated in converter 5 to an AC power supply 1 side.

Converter 5 converts AC power from AC power supply 1 into DC power. Capacitor C4 is connected between an output node 5b of converter 5 and the reference voltage line, and smooths the output voltage of converter 5. Output node 5b of converter 5, an input node 6a of inverter 6, and a first node 7a of bidirectional chopper 7 are connected to each other. Inverter 6 converts DC power from converter 5 or bidirectional chopper 7 into AC power of a commercial frequency.

Reactor L2 and switch S2 are connected in series between an output node 6b of inverter 6 and output terminal T3. Capacitor C2 is connected between a node between reactor L2 and switch S2 and the reference voltage line. Reactor L2 and capacitor C2 constitute an AC output filter (low-pass filter) that passes AC power from inverter 6 to load 3 and suppresses leakage of a signal of a carrier frequency generated in inverter 6 to a load 3 side.

Switch S2 is turned on in an inverter power supply mode in which the AC power generated by inverter 6 is supplied to load 3, and is turned off in a bypass power supply mode in which the AC power from AC power supply 1 is supplied to load 3 via bypass unit 30. In addition, switch S2 is turned off at the time of maintenance or failure of power conversion units 20.

Switch S3 and reactor L3 are connected in series between battery terminal T2 and a second node 7b of bidirectional chopper 7. Capacitor C3 is connected between a node between switch S3 and reactor L3 and the reference voltage line. Switch S3 is turned on in the normal state, and is turned off, for example, at the time of maintenance of power conversion units 20 or battery 2. Capacitor C3 and reactor L3 constitute a low-pass filter that passes DC power and suppresses leakage of a signal of a carrier frequency generated in bidirectional chopper 7 to a battery 2 side.

Bidirectional chopper 7 supplies the DC power generated in converter 5 to battery 2 in the normal state, and supplies the DC power of battery 2 to inverter 6 at the time of a power failure of AC power supply 1.

Switch S4 is connected between output terminal T3 and fan 23. Switch S4 is turned on in the normal state, and is turned off, for example, at the time of maintenance of power conversion units 20.

Now, the operation of power conversion units 20 will be simply described. In a normal state where AC power is supplied from AC power supply 1, the AC power is converted into DC power by converter 5. The DC power is converted into AC power by inverter 6 and the AC power is supplied to load 3, and the DC power is stored in battery 2 by bidirectional chopper 7.

When a power failure occurs and the supply of AC power from AC power supply 1 is stopped, the operation of converter 5 is stopped, and the DC power of battery 2 is supplied to inverter 6 by bidirectional chopper 7 and converted into AC power by inverter 6, and the AC power is supplied to load 3. Therefore, even when the power failure occurs, the operation of load 3 can be continued during a period in which DC power is stored in battery 2.

Bypass unit 30 includes an input terminal T4, an output terminal T5, switches S5 and S6, and fan 33.

Terminals T4 and T5 are electrically connected to terminals T11 and T13 by bus 50, respectively. Switch S5 is connected between terminals T4 and T5. Switch S5 is turned on in the bypass power supply mode and turned off in the inverter power supply mode.

Switch S6 is connected between output terminal T5 and fan 33. Switch S6 is turned on in the bypass power supply mode and turned off in the inverter power supply mode.

As described above, uninterruptible power supply device 100 includes the plurality of power conversion units 20 and bypass unit 30 connected in parallel between AC power supply 1 and load 3. Therefore, the number of power conversion units 20 and bypass unit 30 connected in parallel can be adjusted according to the magnitude of load 3, and as a result, uninterruptible power supply device 100 can easily respond to various loads.

Figure 3:
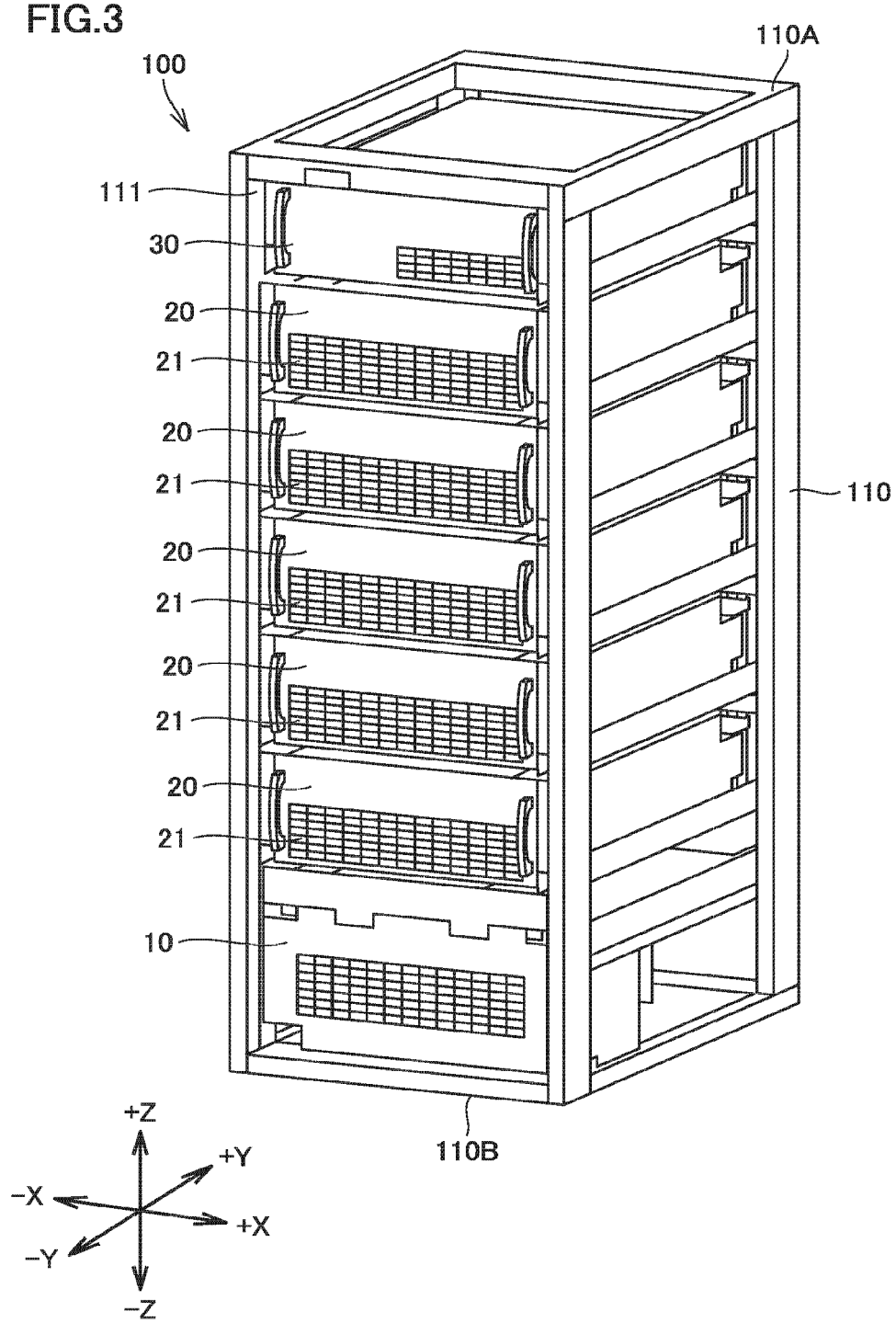
FIG. 3 is a schematic external view showing a configuration example of the uninterruptible power supply device.

FIG. 3 is a schematic external view showing a configuration example of uninterruptible power supply device 100.

Referring to FIG. 3, uninterruptible power supply device 100 includes a housing 110 having a cabinet shape (rectangular parallelepiped shape), and a plurality of units 10, 20 and 30. In FIG. 3, a frame of housing 110 is extracted and shown. In the following description, the right-left direction (horizontal direction) when housing 110 is viewed from the front side is defined as an X-axis direction, the anteroposterior direction is defined as a Y-axis direction, and the vertical direction is defined as a Z-axis direction. Note that the +X direction is a direction pointing to the right along the X-axis direction, and the −X direction is a direction opposite to the +X direction. The +Y direction is a direction from the front surface to the rear surface of uninterruptible power supply device 100, and the −Y direction is a direction opposite to the +Y direction. The +Z direction is a direction pointing upward along the Z-axis direction, and the −Z direction is a direction opposite to the +Z direction.

Housing 110 has an upper surface 110A and a lower surface 110B. Lower surface 110B of housing 110 may be supported by not-shown legs. Housing 110 houses the plurality of units 10, 20, and 30. Housing 110 includes an opening 111 that opens in the −Y direction and a front cover (not illustrated) that covers opening 111. The front cover is provided to open and close opening 111. The front cover is formed with a vent hole for introducing air outside housing 110 into housing 110.

The plurality of units 10, 20, and 30 have a substantially rectangular parallelepiped shape, and is stacked at intervals in the Z-axis direction. The plurality of units 10, 20, and 30 are inserted into housing 110 from the outside of housing 110 through opening 111. Each of the plurality of units 10, 20, and 30 is insertable and removable in the Y-axis direction so as to facilitate maintenance check and replacement with a new one.

The plurality of units 10, 20 and 30 include a terminal unit 10, the plurality of power conversion units 20 and bypass unit 30. Terminal unit 10 houses input terminal T11 for connecting the plurality of power conversion units 20 and bypass unit 30 in parallel to AC power supply 1, output terminal T13 for connecting the plurality of power conversion units 20 and bypass unit 30 in parallel to load 3, and battery terminal T12 for connecting the plurality of power conversion units 20 to battery 2. Although terminal unit 10 is arranged below the plurality of power conversion units 20 and bypass unit 30 in the example of FIG. 3, terminal unit 10 may be arranged above the plurality of power conversion units 20 and bypass unit 30. The number of power conversion units 20 is not limited to five. The number of bypass unit 30 is not limited to one.

Figure 4:
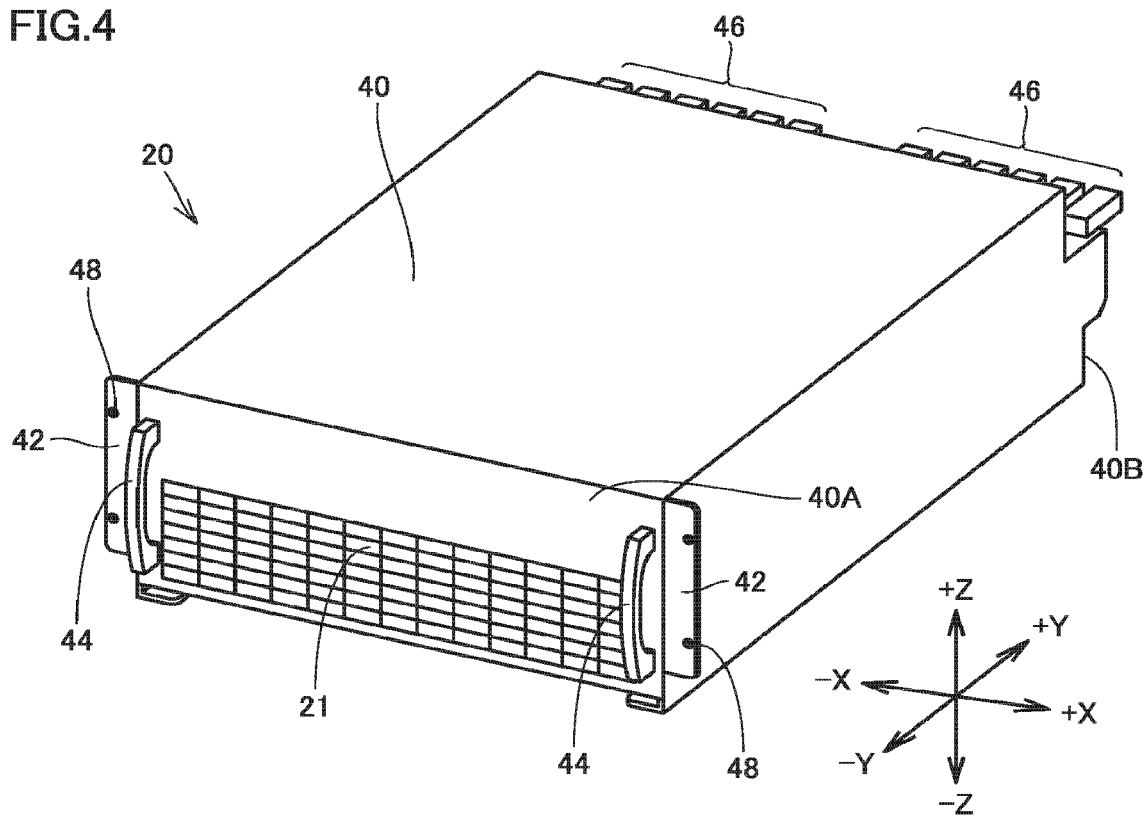
FIG. 4 is a schematic external view showing a configuration example of the power conversion unit.

FIG. 4 is a schematic external view showing a configuration example of power conversion unit 20.

Referring to FIG. 4, power conversion unit 20 includes a housing 40 having a rectangular parallelepiped shape, a pair of flange members 42, a pair of grip members 44, and a plurality of terminal members 46.

A vent 21 is formed in a front surface 40A of housing 40, and a not-shown vent is formed in a rear surface 40B. Housing 40 houses fan 23 (see FIG. 2) for air intake from front surface 40A and air discharge from rear surface 40B. Housing 40 further houses switches S1 to S4, capacitors C1 to C4, reactors L1 to L3, converter 5, inverter 6, and bidirectional chopper 7 that are shown in FIG. 2.

The pair of grip members 44 are attached to both ends of front surface 40A of housing 40 in the horizontal direction (X-axis direction). By gripping the pair of grip members 44 and moving the pair of grip members 44 in the +Y direction, power conversion unit 20 can be inserted into housing 110.

The pair of flange members 42 are connected to the both ends of front surface 40A of housing 40 in the horizontal direction. A through hole 48 is formed in each flange member 42. By inserting a bolt through through hole 48 and fastening the bolt to housing 110, with power conversion unit 20 inserted into housing 110, power conversion unit 20 can be fixed to housing 110.

The plurality of terminal members 46 are provided on rear surface 40B of housing 40. The plurality of terminal members 46 constitute input terminal T1, output terminal T3 and battery terminal T2 (see FIG. 2). Each terminal member 46 is connected to bus 50 (see FIG. 7). Bus 50 electrically connects terminal members 46 of the plurality of power conversion units 20 and terminal members of bypass unit 30. Furthermore, bus 50 electrically connects these terminal members 46 to terminals T11, T12 and T13.

Referring again to FIG. 3, a vent is formed in a front surface of bypass unit 30, and a vent is formed in a rear surface. Bypass unit 30 houses fan 33 (see FIG. 2) for air intake from the front surface and air discharge from the rear surface. Bypass unit 30 further houses switches S5 and S6 shown in FIG. 2. The number of fans incorporated in each of power conversion units 20 and bypass unit 30 is not limited.

Figure 5:
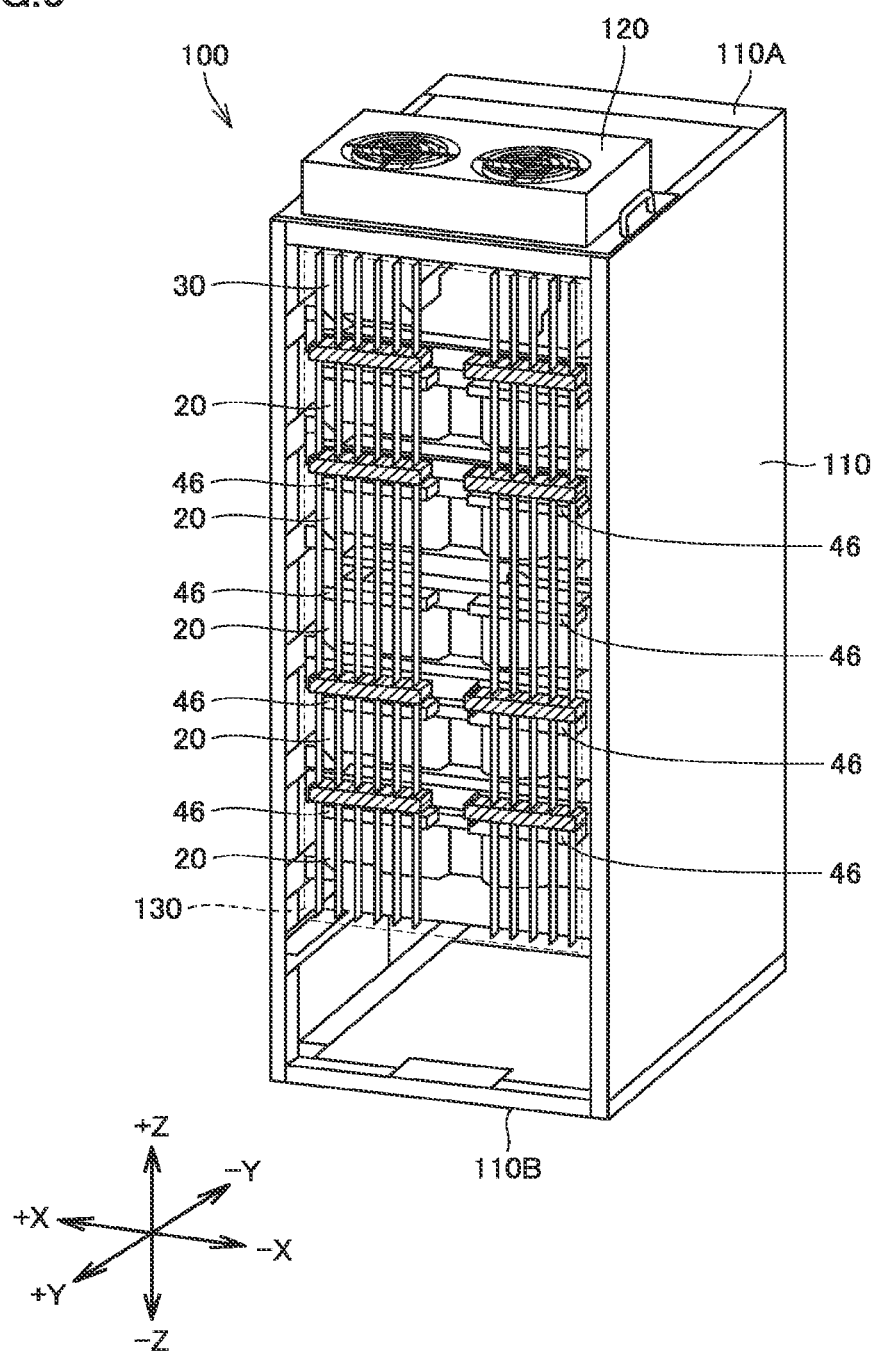
FIG. 5 is a perspective rear view of the uninterruptible power supply device shown in FIG. 3 when viewed from rear.

FIG. 5 is a perspective rear view of uninterruptible power supply device 100 shown in FIG. 3 when viewed from rear. FIG. 5 shows an internal configuration of uninterruptible power supply device 100, with a rear cover removed.

Uninterruptible power supply device 100 further includes a fan unit 120 and a bus unit 130. Fan unit 120 is arranged on upper surface 110A of housing 110. Fan unit 120 sucks air inside housing 110 and discharges the sucked air to the outside of housing 110. As a result, air is introduced into housing 110 through a ventilation hole of the front cover of housing 110, and the introduced air passes through the plurality of units 20 and 30, thereby promoting heat dissipation of the plurality of units 20 and 30. The air heated by passing through the plurality of units 20 and 30 is discharged to the outside of housing 110.

Figure 6:
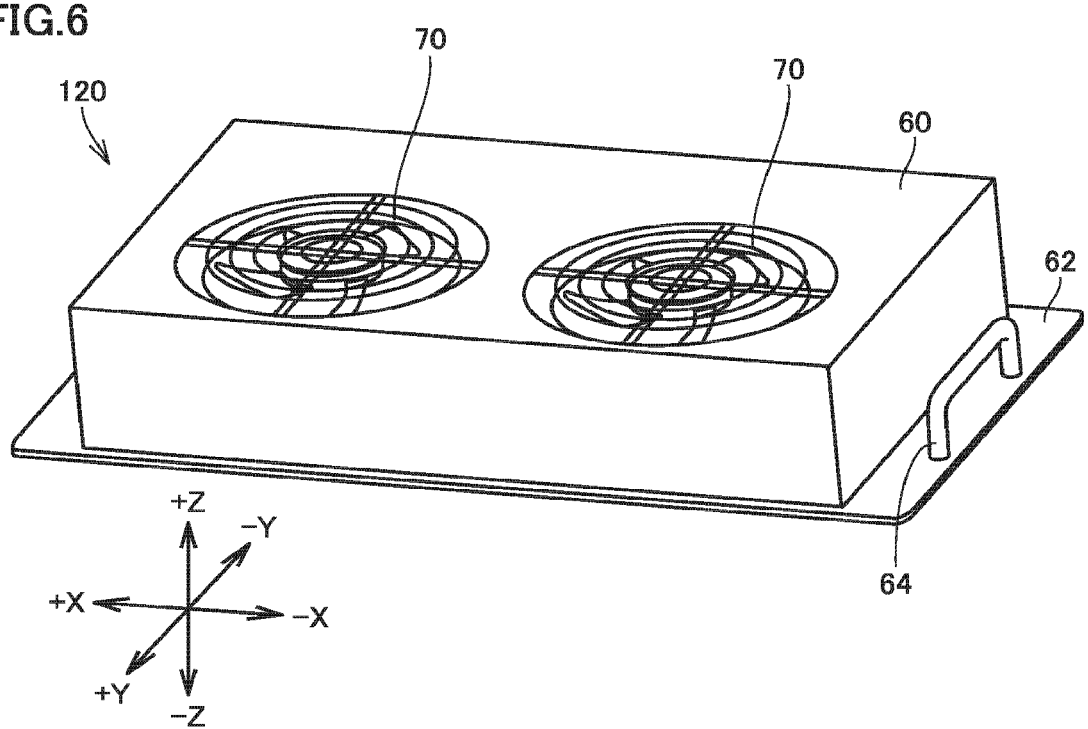
FIG. 6 is an external view schematically showing a configuration example of a fan unit.

FIG. 6 is an external view schematically showing a configuration example of fan unit 120. Referring to FIG. 6, fan unit 120 includes a housing 60 having a rectangular parallelepiped shape, a flange member 62 and a pair of grip members 64.

Housing 60 has a plurality of fans 70 incorporated therein. The plurality of fans 70 are aligned on upper surface 110A of housing 110. Although fan unit 120 includes two fans 70 in the example of FIG. 6, the number of fans 70 is not limited to two. The number of fans 70 may be one.

Flange member 62 is provided to surround an outer edge of an opening of housing 60. The pair of grip members 64 are attached to flange member 62. A not-shown through hole is formed in flange member 62. By inserting a bolt through the through hole and fastening the bolt to upper surface 110A, with housing 60 arranged on upper surface 110A of housing 110, fan unit 120 can be fixed to housing 110.

In the present embodiment, by integrating the plurality of fans 70 for discharging air in housing 110 into one unit, the number of fans 70 can be easily changed, as compared with a configuration in which the plurality of fans 70 are individually arranged on upper surface 110A of housing 110. That is, a plurality of types of fan units 120 that house the different number of fans 70 can be prepared in advance. Thus, by replacing fan units 120 according to a change in capacity of uninterruptible power supply device 100, the number of fans 70 can be easily changed.

Referring again to FIG. 5, bus unit 130 is housed in housing 110 and is arranged to face the rear cover of housing 110. Bus unit 130 includes a plurality of buses 50 for electrically connecting the plurality of units 20 and 30.

FIG. 7 is an external view schematically showing a configuration example of bus unit 130. Referring to FIG. 7, bus unit 130 includes the plurality of buses 50, a plurality of support members 54 and a plurality of fixing members 56.

Each bus 50 extends in the vertical direction (Z-axis direction) of housing 110. Each bus 50 is made of a strip-shaped electrically conductive member. A part of the electrically conductive member is punched, such that terminal members 46 of each power conversion unit 20 and the terminal members of bypass unit 30 can be coupled.

Generally, a rated current that can flow through each bus 50 is determined by a cross-sectional area of bus 50 and a predetermined upper limit value of a current density of bus 50. As the rated current of bus 50 becomes larger, the required cross-sectional area of bus 50 becomes larger.

Each support member 54 is configured to support the plurality of buses 50 such that the plurality of buses 50 are spaced apart from each other in the horizontal direction (X-axis direction). Support member 54 is made of an insulating material. When bus unit 130 includes the plurality of support members 54 as shown in FIG. 7, the plurality of (e.g., two) support members 54 can be aligned in the horizontal direction, and the plurality of support members 54 can be grouped into one set and a plurality of sets of support members 54 can be arranged apart from each other in the vertical direction. The number and arrangement position of support members 54 can be selected as appropriate, according to the number of buses 50 included in bus unit 130, the length of each bus 50 in the vertical direction, and the like.

Fixing members 56 are provided to correspond to support members 54. Fixing members 56 removably fix support members 54 to housing 110. In the example of FIG. 7, each fixing member 56 is a plate-shaped member extending in the horizontal direction (X-axis direction) of housing 110. The plate-shaped member has a flat plate shape. Two support members 54 aligned in the horizontal direction are coupled to each fixing member 56. The plurality of fixing members 56 are provided to correspond to the plurality of sets of support members 54, respectively. The plurality of fixing members 56 are arranged apart from each other in the vertical direction.

At least one through hole 58 is formed in both ends of each fixing member 56 in the horizontal direction. By inserting a bolt through through hole 58 and fastening the bolt to a frame of housing 110, with bus unit 130 arranged to face the rear surface of housing 110 as shown in FIG. 5, bus unit 130 can be fixed to housing 110.

As described above, in uninterruptible power supply device 100 according to the present embodiment, by adjusting the number of power conversion units 20 connected in parallel to load 3, the capacity of uninterruptible power supply device 100 can be changed according to the magnitude of load 3. However, there is a limit to the number of power conversion units 20 that can be housed in housing 110, and thus, there is also a limit to an increase in capacity of uninterruptible power supply device 100. In such a case, a change in structure of housing 110 is required to cope with the increase in capacity of uninterruptible power supply device 100.

In order to increase the capacity of uninterruptible power supply device 100 by using existing housing 110, a method for increasing the capacity of one power conversion unit 20 can be adopted. Specifically, by replacing each of a power converter such as converter 5 housed in housing 40 and electrical components such as reactors L1 to L3 with one having a larger acceptable current in power conversion unit 20 shown in FIG. 4, the capacity of one power conversion unit 20 can be increased.

However, when the capacity of each power conversion unit 20 is increased, a current that flows through buses 50 that electrically connect the plurality of power conversion units 20 also increases. In order to cope with the increase in current, an increase in size of each bus 50, such as an increase in cross-sectional area of each bus 50, is required.

In the present embodiment, the plurality of buses 50 for electrically connecting the plurality of power conversion units 20 are integrated into one unit. This makes it possible to easily achieve an increase in size of the plurality of buses 50, as compared with a configuration in which the plurality of buses 50 are individually arranged in housing 110. That is, a plurality of types of bus units 130 including buses 50 having different cross-sectional areas can be prepared in advance. Thus, by replacing bus units 130 housed in housing 110 with bus units 130 including buses 50 each having a larger rated current, according to the increase in capacity of uninterruptible power supply device 100, an increase in size of the plurality of buses 50 can be easily achieved. Since each bus unit 130 is fastened to housing 110 by using the fastening members as shown in FIG. 7, bus unit 130 can be easily replaced. As a result, the capacity of uninterruptible power supply device 100 can be simply and easily increased by using existing housing 110.

It should be understood that the embodiment disclosed herein is illustrative and non-restrictive in every respect. The scope of the present invention is defined by the terms of the claims, rather than the description above, and is intended to include any modifications within the scope and meaning equivalent to the terms of the claims.

REFERENCE SIGNS LIST

1 AC power supply; 2 battery; 3 load; 5 converter; 6 inverter; 7 bidirectional chopper; 10 terminal unit; 20 power conversion unit; 21 vent; 23, 33, 70 fan; 30 bypass unit; 40, 60, 110 housing; 42, 62 flange member; 44, 64 grip member; 46 terminal member; 48, 58 through hole; 50 bus; 54 support member; 56 fixing member; 100 uninterruptible power supply device; 110A upper surface; 110B lower surface; 111 opening; 112 leg; 120 fan unit; 130 bus unit; L1 to L3 reactor; C1 to C4 capacitor; S1 to S6 switch; T1 to T5, T11 to T13 terminal.

The invention claimed is:

1. An uninterruptible power supply device comprising:
a housing having a rectangular parallelepiped shape;
a plurality of power conversion units stacked in a vertical direction and housed in the housing; and
a bus unit for connecting the plurality of power conversion units in parallel to each other, wherein
the bus unit is arranged in the housing to face a rear surface of the housing, and
the bus unit includes:
a plurality of buses extending in the vertical direction;
at least one support member that supports the plurality of buses such that the plurality of buses are spaced apart from each other in a horizontal direction; and
at least one fixing member that removably fixes each support member to the housing, wherein
each fixing member includes a plate-shaped member extending in the horizontal direction, the support member being connected to the plate-shaped member, and
both ends of the plate-shaped member in the horizontal direction are fixed to the housing.

2. The uninterruptible power supply device according to claim 1, wherein
through holes are formed in the both ends of the plate-shaped member in the horizontal direction, and
the each fixing member is fixed to the housing by fastening members inserted through the through holes.

3. The uninterruptible power supply device according to claim 1, wherein
the at least one support member includes a plurality of support members arranged apart from each other in the vertical direction, and
the at least one fixing member includes a plurality of fixing members that fix the plurality of support members to the housing, respectively.

4. The uninterruptible power supply device according to claim 1, further comprising
a fan unit detachably attached to an upper surface of the housing, wherein
the fan unit includes a plurality of fans aligned on the upper surface.

5. The uninterruptible power supply device according to claim 1, wherein
the plurality of power conversion units are connected in parallel to each other between an AC power supply and a load by the bus unit, and
each of the plurality of power conversion units includes:
a converter that converts AC power supplied from the AC power supply into DC power; and
an inverter that converts DC power generated by the converter into AC power and supplies the AC power to the load in a normal state in which the AC power is supplied from the AC power supply, and converts DC power stored in a power storage device into AC power and supplies the AC power to the load at the time of a power failure in which the supply of the AC power from the AC power supply is stopped.

6. The uninterruptible power supply device according to claim 2, wherein the at least one support member includes a plurality of support members arranged apart from each other in the vertical direction, and the at least one fixing member includes a plurality of fixing members that fix the plurality of support members to the housing, respectively.

7. The uninterruptible power supply device according to claim 2, further comprising a fan unit detachably attached to an upper surface of the housing, wherein the fan unit includes a plurality of fans aligned on the upper surface.

8. The uninterruptible power supply device according to claim 3, further comprising a fan unit detachably attached to an upper surface of the housing, wherein the fan unit includes a plurality of fans aligned on the upper surface.

9. The uninterruptible power supply device according to claim 2, wherein the plurality of power conversion units are connected in parallel to each other between an AC power supply and a load by the bus unit, and each of the plurality of power conversion units includes:

a converter that converts AC power supplied from the AC power supply into DC power; and an inverter that converts DC power generated by the converter into AC power and supplies the AC power to the load in a normal state in which the AC power is supplied from the AC power supply, and converts DC power stored in a power storage device into AC power and supplies the AC power to the load at the time of a power failure in which the supply of the AC power from the AC power supply is stopped.

10. The uninterruptible power supply device according to claim 3, wherein the plurality of power conversion units are connected in parallel to each other between an AC power supply and a load by the bus unit, and each of the plurality of power conversion units includes:

a converter that converts AC power supplied from the AC power supply into DC power; and an inverter that converts DC power generated by the converter into AC power and supplies the AC power to the load in a normal state in which the AC power is supplied from the AC power supply, and converts DC power stored in a power storage device into AC power and supplies the AC power to the load at the time of a power failure in which the supply of the AC power from the AC power supply is stopped.

11. The uninterruptible power supply device according to claim 4, wherein the plurality of power conversion units are connected in parallel to each other between an AC power supply and a load by the bus unit, and each of the plurality of power conversion units includes:

a converter that converts AC power supplied from the AC power supply into DC power; and an inverter that converts DC power generated by the converter into AC power and supplies the AC power to the load in a normal state in which the AC power is supplied from the AC power supply, and converts DC power stored in a power storage device into AC power and supplies the AC power to the load at the time of a power failure in which the supply of the AC power from the AC power supply is stopped.

* * * * *